(12) United States Patent
Banerji et al.

(10) Patent No.: US 7,799,671 B1
(45) Date of Patent: Sep. 21, 2010

(54) INTERFACIAL LAYERS FOR ELECTROMIGRATION RESISTANCE IMPROVEMENT IN DAMASCENE INTERCONNECTS

(75) Inventors: Ananda Banerji, West Linn, OR (US); George Andrew Antonelli, Portland, OR (US); Jennifer O'Loughlin, Portland, OR (US); Mandyam Sriram, Beaverton, OR (US); Bart van Schravendijk, Sunnyvale, CA (US); Seshasayee Varadarajan, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/630,457

(22) Filed: Dec. 3, 2009

Related U.S. Application Data

(63) Continuation of application No. 12/074,108, filed on Feb. 28, 2008, now Pat. No. 7,648,899.

(51) Int. Cl.
*H01L 21/44* (2006.01)

(52) U.S. Cl. ............... 438/598; 257/E21.475; 257/E21.479

(58) Field of Classification Search ......... 438/598, 438/4, 622, 634; 257/624, E21.575, E21.579
See application file for complete search history.

(56) References Cited

U.S. PATENT DOCUMENTS

| 4,282,268 | A | 8/1981 | Priestley et al. |
| 6,143,657 | A | 11/2000 | Liu et al. |
| 6,181,013 | B1 | 1/2001 | Liu et al. |
| 6,271,595 | B1 | 8/2001 | McGahay et al. |
| 6,750,541 | B2 | 6/2004 | Ohtsuka et al. |
| 6,821,890 | B2 | 11/2004 | McGahay et al. |
| 6,855,645 | B2 | 2/2005 | Tang et al. |
| 6,974,768 | B1 | 12/2005 | Kailasam |
| 7,060,619 | B2 | 6/2006 | Cowley et al. |

(Continued)

FOREIGN PATENT DOCUMENTS

JP 2000-252278 9/2000

OTHER PUBLICATIONS

Novellus Systems, Inc., van Schravendijk et al., "Protection of CU Damascene Interconnects by Formation of a Self-Aligned Buffer Layer" U.S. Appl. No. 10/980,076, filed Nov. 3, 2004 (37 pages).

(Continued)

*Primary Examiner*—Thomas L Dickey
*Assistant Examiner*—Nikolay Yushin
(74) *Attorney, Agent, or Firm*—Weaver Austin Villeneuve & Sampson LLP

(57) ABSTRACT

Protective caps residing at an interface between metal lines and dielectric diffusion barrier (or etch stop) layers are used to improve electromigration performance of interconnects. Protective caps are formed by depositing a source layer of dopant-generating material (e.g., material generating B, Al, Ti, etc.) over an exposed copper line, converting the upper portion of the source layer to a passivated layer (e.g., nitride or oxide) while allowing an unmodified portion of a dopant-generating source layer to remain in contact with copper, and, subsequently, allowing the dopant from the unmodified portion of source layer to controllably diffuse into and/or react with copper, thereby forming a thin protective cap within copper line. The cap may contain a solid solution or an alloy of copper with the dopant.

21 Claims, 8 Drawing Sheets

U.S. PATENT DOCUMENTS

| | | | |
|---|---|---|---|
| 7,202,185 | B1 | 4/2007 | Hausmann et al. |
| 7,211,509 | B1 | 5/2007 | Gopinath et al. |
| 7,239,017 | B1 | 7/2007 | Yu et al. |
| 7,247,946 | B2 | 7/2007 | Bruley et al. |
| 7,282,438 | B1 | 10/2007 | Yu et al. |
| 7,297,608 | B1 | 11/2007 | Papasouliotis et al. |
| 7,396,759 | B1 | 7/2008 | Van Schravendijk et al. |
| 7,576,006 | B1 | 8/2009 | Yu et al. |
| 7,420,275 | B1 | 9/2009 | Yu et al. |
| 7,648,899 | B1 | 1/2010 | Banerji et al. |
| 7,727,880 | B1 | 6/2010 | Chattopadhyay et al. |
| 7,727,881 | B1 | 6/2010 | Chattopadhyay et al. |
| 2001/0006701 | A1 | 7/2001 | Kobayashi et al. |
| 2002/0066411 | A1 | 6/2002 | Chiang et al. |
| 2002/0155702 | A1 | 10/2002 | Aoki et al. |
| 2003/0209738 | A1 | 11/2003 | Ohto et al. |
| 2004/0097075 | A1 | 5/2004 | Bradshaw et al. |
| 2004/0238963 | A1 | 12/2004 | Fujisawa |
| 2006/0046479 | A1 | 3/2006 | Rajagopalan et al. |
| 2007/0035029 | A1 | 2/2007 | Caubet et al. |
| 2007/0037388 | A1 | 2/2007 | Hohage et al. |
| 2007/0105377 | A1 | 5/2007 | Koos et al. |

OTHER PUBLICATIONS

U.S. Appl. No. 11/709,293, filed Feb. 20, 2007, Entitled "Protective Self-Aligned Buffer Layers for Damascene Interconnects".

U.S. Appl. No. 11/709,294, filed Feb. 20, 2007, Entitled: "Protective Self-Aligned Buffer Layers for Damascene Interconnects".

U.S. Appl. No. 11/710,652, filed Feb. 22, 2007, Entitled: "Improved Diffusion Barrier And Etch Stop Films".

Office Action dated Jun. 13, 2007, Novellus Systems, Inc., van Schravendijk et al., "Protection of CU Damascene Interconnects by Formation of a Self-Aligned Buffer Layer" U.S. Appl. No. 10/980,076, filed Nov. 3, 2004.

Renesas Technology Corp., Japan, "Reliability Improvement and its Mechanism for Cu Interconnects with Cu-Al Alloy Seeds", pp. 77 & 78 (not dated).

IEEE 07CH37867 45th Annual International Reliability Physics Symposium, Phoenix, 2007, NEC Electronics Corporation, Japan "Analytical Study of Impurity Doping Effects on Electromigration of Cu Interconnects by Employing Comprehensive Scattering Model", pp. 117-121.

IEEE © 2004, Taiwan Semiconductor Manufacturing Company, Ltd., "High Performane Cu interconnects capped with Full-Coverage ALD TaNx layer for Cu/Low-k (k~2.5) Metallization", pp. 72-74.

IEEE © 2005, NEC Corporation and NEC Electronics, Japan, A Robust 45 nm-node, Dual Damascene Interconnects with High Quality Cu/barrier Interface by a Novel Oxygen Absorption Process (4) four pages.

U.S. Office Action, mailed Nov. 28, 2007, for U.S. Appl. No. 10/980,076.

U.S. Office Action, mailed Aug. 21, 2008 for U.S. Appl. No. 11/888,323.

U.S. Office Action, mailed Apr. 2, 2009 for U.S. Appl. No. 12/074,108.

Quirk, "Semiconductor manufacturing technology", 2001, Prentice Hall, pp. 522-527.

Notice of Allowance and Fee Due mailed Jun. 17, 2009 for U.S. Appl. No. 11/888,323.

Allowed Claims for U.S. Appl. No. 11/888,323.

U.S. Office Action mailed Sep. 1, 2009 for U.S. Appl. No. 11/709,293.

U.S. Office Action mailed Sep. 4, 2009 for U.S. Appl. No. 11/709,294.

U.S. Appl. No. 11/832,519, filed Aug. 1, 2007.

Notice of Allowance and Fee Due, mailed Sep. 4, 2009, for U.S. Appl. No. 12/074,108 and Allowed Claims.

U.S. Notice of Allowance and Allowed Claims mailed Jan. 29, 2010 for U.S. Appl. No. 11/709,293.

U.S. Notice of Allowance and Allowed Claims mailed Feb. 22, 2010 for U.S. Appl. No. 11/709,294.

Novellus Systems, Inc., Chattopadhyay et al., "Protective Self-Aligned Buffer Layers for Damascene Interconnects", U.S. Appl. No. 12/762,223, filed Apr. 16, 2010.

Novellus Systems, Inc., Chattopadhyay et al., "Protective Self-Aligned Buffer Layers for Damascene Interconnects", U.S. Appl. No. 12/763,545, filed Apr. 20, 2010.

Novellus Systems, Inc. Yu et al., "Interfacial Capping Layers for Interconnects", U.S. Appl. No. 12/688,154, filed Jan. 15, 2010.

Novellus Sytstems, Inc., Banerji et al., "Interfacial Layers for Electromigration Resistance Improvement in Damaascene Interconnects", U.S. Appl. No. 12/689,803, filed Jan. 19, 2010.

Novellus Sytstems, Inc., Yu et al., "Protective Self-Aligned Buffer Layers for Damascene Interconnects", U.S. Appl. No. 12/693,645, filed Jan. 26, 2010.

INTERFACIAL LAYERS FOR ELECTROMIGRATION RESISTANCE IMPROVEMENT IN DAMASCENE INTERCONNECTS

CROSS REFERENCE TO RELATED PATENT APPLICATIONS

This application is a continuation of application Ser. No. 12/074,108 filed Feb. 28, 2008, titled "Interfacial layers for electromigration resistance improvement in damascene interconnects" by Ananda Banerji et al., which is incorporated herein by reference in its entirety and for all purposes.

FIELD OF THE INVENTION

The present invention pertains to methods of forming layers of material on a partially fabricated integrated circuit. Specifically, the invention pertains to methods for forming protective caps within copper lines for improving electromigration properties of Damascene interconnects.

BACKGROUND OF THE INVENTION

Damascene processing is a method for forming metal lines on integrated circuits. It involves formation of inlaid metal lines in trenches and vias formed in a dielectric layer (inter layer dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal is deposited onto a patterned dielectric to fill the vias and trenches formed in the dielectric layer. The resulting metallization layer is typically formed either directly on a layer carrying active devices, or on a lower-lying metallization layer. A thin layer of a dielectric diffusion barrier material, such as silicon carbide or silicon nitride, is deposited between adjacent metallization layers to prevent diffusion of metal into bulk layers of dielectric. In some cases, silicon carbide or silicon nitride dielectric diffusion barrier layer also serves as an etch stop layer during patterning of inter layer dielectric (ILD).

In a typical integrated circuit (IC), several metallization layers are deposited on top of each other forming a stack, where metal-filled vias and trenches serve as IC conducting paths. The conducting paths of one metallization layer are connected to the conducting paths of an underlying or overlying layer by a series of Damascene interconnects.

Fabrication of these interconnects presents several challenges, which become more and more significant as the dimensions of IC device features continue to shrink. Currently, at the 90 nm technology node and at more advanced nodes, there is a strong need for interconnect fabrication methods that can provide interconnects with improved lifetime and reliability.

SUMMARY OF THE INVENTION

One challenging problem encountered during IC fabrication is electromigration failure. Electromigration occurs when high current densities experienced by an interconnect lead to migration of metal atoms with the current, and, consequently, lead to formation of voids within interconnects. Ultimately, formation of voids may lead to failure of the device, known as electromigration failure. During ongoing miniaturization of IC devices, interconnect dimensions are decreased, and larger current densities are experienced by interconnects. As a consequence, the probability of electromigration failure increases with such device miniaturization. While copper has a greater electromigration resistance than aluminum, even in copper interconnects, electromigration failure becomes a significant reliability problem at 45 nm technology node and at more advanced nodes.

Protective caps residing at an interface between metal lines and dielectric diffusion barrier (or etch stop) layers that are capable of improving electromigration performance of interconnects are herein provided. Methods for forming such caps are also described. Advantageously, the described protective caps can be formed as very thin layers residing within the upper portion of a metal line at its interface with the dielectric diffusion barrier layer, without significantly increasing interconnect resistance. The protective capping layer may include, for example, a solid solution, an alloy, or a compound of the interconnect metal, such as copper, with a doping element, such as boron, aluminum, titanium, etc. In many embodiments, it is advantageous to choose doping elements that would form alloys with an interconnect metal and/or will accumulate at the grain boundaries, thereby reducing migration of interconnect metal atoms.

The provided methods achieve control over the thickness of protective caps by depositing a source layer of dopant-generating material (e.g., material containing B, Al, Ti, etc.) over an exposed metal line, converting the upper portion of the source layer to a passivated layer (e.g., nitride or oxide) while allowing an unmodified portion of a dopant-generating source layer to remain in contact with an interconnect metal, and, subsequently, allowing the dopant from the unmodified portion of source layer to diffuse into and/or react with the interconnect metal. In one embodiment the amount of dopant introduced into interconnect is limited by the thickness of the unmodified portion of source layer residing in contact with the interconnect. In other embodiments, the amount of dopant introduced into interconnect is controlled by controlling the temperature during diffusion and/or reaction.

Advantageously, thin protective caps formed in this controlled manner do not significantly increase the resistance of interconnects, as often inadvertently happens when large amounts of highly reactive or easily diffusing dopants (e.g., Si, or Ge) are deposited onto the interconnect metal. In addition, as it will be described, provided methods are suitable for forming protective capping layers from dopant-generating source layer that is deposited with little or no selectivity onto both exposed metal and dielectric. It is understood that these methods can be also used in those cases, when the dopant-containing source layer deposits selectively only onto the metal layer without significantly depositing onto dielectric.

According to one aspect, a method for forming a semiconductor device structure is provided. In one embodiment, the method includes the operations of (a) contacting a substrate having an exposed layer of a first metal (e.g., copper or copper alloy) and an exposed layer of dielectric with a compound comprising boron or a second metal (e.g., Al, Hf, Ti, Co, Ta, Mo, Ru, Sn, Sb, etc.) to deposit a source layer comprising boron or a second metal over both the dielectric and the first metal; (b) modifying a top portion of the source layer at least over the region of the first metal to form a passivated layer, wherein a portion of the unmodified source layer remains in contact with the layer of the first metal; and (c) allowing an active component from the unmodified source layer to diffuse into and/or react with the first metal and to form a protective cap within the layer of the first metal.

In one embodiment the substrate is a Damascene structure which contains exposed copper lines embedded in a layer of inter-metal dielectric. Prior to deposition of the source layer, the substrate can be optionally pre-cleaned to remove the contaminants (e.g., copper oxide) from copper surface. For example, pre-clean can be performed by exposing the substrate to a reducing gas (e.g., $H_2$ or $NH_3$) in a plasma. The source layer containing the source of dopant (active component) can then be deposited by contacting the substrate with a volatile dopant precursor at a certain temperature. Typically (although not necessarily) deposition of the source layer is performed thermally in the absence of a plasma discharge. Pre-clean and deposition of the source layer may be performed in a CVD apparatus without a vacuum break, e.g., in the same process chamber.

In one embodiment, a boron-containing source layer is deposited by contacting the substrate with a gas mixture containing $B_2H_6$ (or other volatile boron-containing precursor) and an inert carrier gas at a chamber temperature of between about 200-400° C. in the absence of plasma discharge. The pressure in the deposition chamber is maintained in the range of about 0.5-10 Torr, and the concentration of $B_2H_6$ in the gas mixture ranges from between about 0.5 to 20% by volume. Under such conditions, a boron-containing source layer is deposited both onto exposed dielectric and onto metal portions of the substrate. The source layer was found to contain B—H bonds and will be therefore referred to as a $BH_x$ layer.

In many embodiments, a greater amount of dopant source material is deposited over metal portions of the substrate as compared to its dielectric portions, due to higher precursor decomposition rates at the metal surface. As a result, in these embodiments, the thickness of the source layer deposited over metal portions is greater than the thickness of the source layer deposited over the dielectric. However, complete deposition selectivity between metal and dielectric is typically difficult to attain for many boron-containing precursors and for metal-containing precursors. Advantageously, the described deposition methods do not require absolute metal/dielectric selectivity for deposition of the source layer.

In some embodiments, metal-containing source layers are deposited by contacting the substrate with a volatile metal-containing precursor, such as metal halide, metal hydride, metal carbonyl, or a volatile organometallic compound, under temperatures and pressures suitable for causing precursor decomposition and deposition of a metal-containing layer on a substrate. In many cases, similar temperature and pressure ranges, as listed above for deposition of $BH_x$ layer are used. One of skill in the art would understand how to optimize deposition conditions for different types of metal precursors.

A number of metals are suitable as dopants for forming protective caps. These include metals, forming solid solutions, alloys, or intermetallic phases with interconnect metal, and metals capable of diffusing and accumulating at grain boundaries in an interconnect. For example Al, Hf, Ti, Co, Ta, Mo, Ru, Sn, and Sb can be used as components of protective caps. Alloys and solid solutions of these metals with each other or with other metals may be also employed. Suitable volatile precursors for an aluminum-containing source layer include but are not limited to trimethylaluminum, dimethyl aluminum hydride, triethylaluminum, triisobutylaluminum, and tris(diethylamino)aluminum. Suitable precursors for deposition of other metals include but are not limited to bis(cyclopentadienyl)cobalt, cobalt (II) acetylacetonate, tetrakis(dimethylamido)hafnium, tetrakis(diethylamido) hafnium, tetrakis(dimethylamido)molybdenum, tetrakis (dimethylamino)titanium (TDMAT), tetrakis(diethylamino) titanium (TDEAT), tetrakis(ethylmethylamido)titanium, bis (diethylamino)bis(diisopropylamino)titanium, pentakis (dimethylamino)tantalum, tert(butylimidotris) (diethylamido)tantalum (TBTDET), pentakis(diethylamido) tantalum, bis(ethylcyclopentadienyl)ruthenium, tris (dimethylamido)antimony, and tetramethyltin.

As it was mentioned, after the source layer containing boron or metal is deposited, its top portion is modified to form a passivated layer, e.g., a layer containing nitride or oxide, while its bottom portion remains unmodified and in contact with the interconnect metal. In many embodiments, where the source layer is deposited to a greater thickness over metal than over dielectric, the modification operation completely converts the portion of the source layer residing over dielectric to a passivated layer which contains material having low conductivity (e.g., $BN_x$, $Al_xO_y$, etc.). Such modification is performed to prevent shorting between adjacent interconnects. Further, partial modification of the source layer residing over metal lines serves to control the amount of dopant residing in the layer and provides an avenue to control the thickness of protective cap and consequently to control interconnect resistivity.

A number of processes can be used to form passivated layers. In one embodiment the source layer is modified by exposing the substrate to a nitrogen-containing reactant in a plasma discharge. For example $NH_3$, $N_2H_4$, amines, $N_2$ and mixtures thereof can be used. In a specific example, a $BH_x$ source layer is modified to form a passivated layer containing $BN_x$ by contacting the substrate with a mixture of $N_2$ and $NH_3$ in a plasma. In other embodiments a source layer (e.g., metal-containing source layer) is modified by exposing the substrate to an oxygen-containing compound (e.g., $O_2$, $N_2O$, or $CO_2$) in a plasma discharge, to form a passivated layer containing oxide (e.g., aluminum oxide, titanium oxide, etc.) Yet in other embodiments a source layer is modified with a carbon containing reactant in a plasma to form a passivated layer containing carbides or hydrocarbons (e.g., $BC_x$, $C_xH_y$, etc.).

The thickness of modified layer can be tailored as desired. By controlling the thickness of the modified layer, the thickness of the remaining unmodified layer containing the dopant source is controlled, also resulting in control over the thickness of the protective cap within the interconnect. For example, between about 20-60% of the source layer thickness residing over metal line, can be modified to form a passivated layer, while leaving the unmodified dopant-containing portion in contact with the metal line. In one example, the source layer residing over the metal line has a thickness of between about 50-500 Å. After between about 20-60% of the source layer thickness is converted to a passivated layer, between about 20-400 Å of unmodified source layer remains in contact with the metal line.

Next, after the modified layer is formed, an active component from the unmodified source layer is allowed to diffuse into and/or react with the interconnect metal and to form a protective cap within the layer of interconnect metal. In some embodiments, the active component is first generated within the source layer, prior to forming the protective cap. Depending on the nature of the active component, a variety of conditions can be used to generate the active component and to promote its diffusion into the interconnect metal. In some embodiments, exposing the substrate to high temperature for a predetermined amount of time promotes the formation of protective cap within the metal interconnect. In other embodiments, formation of protective cap occurs at room temperature after allowing sufficient time for dopant diffusion.

In some embodiments after the passivated layer is formed, an etch stop layer or a dielectric diffusion barrier layer (e.g., a layer comprising doped or undoped silicon carbide or silicon nitride) is deposited onto the passivated layer. In other embodiments, the passivated layer itself may serve as an etch stop layer or a dielectric diffusion barrier layer, and no separate etch stop layer is required. In the latter embodiment inter-metal dielectric is deposited directly onto the passivated layer.

In some embodiments, doping of interconnect metal by allowing the dopant to diffuse into and/or react with the interconnect metal is performed after the dielectric diffusion barrier or etch stop layer is deposited. For example, the substrate may be heated to at least about 100° C. after an etch stop layer (e.g., silicon carbide layer), has been deposited, to promote formation of the protective cap.

Advantageously, in some embodiments, the entire cap-forming process, and diffusion barrier (or etch stop) deposition process are performed sequentially in one module without a vacuum break. A PECVD module apparatus having multiple stations within one chamber, or having multiple chambers, is a suitable apparatus for such deposition. Remarkably, both metal-containing layers and dielectric layers can be deposited sequentially in one PECVD apparatus without a vacuum break. For example, in one embodiment, the process involves depositing a metal-containing source layer, converting the top portion of the source layer to a passivated layer, allowing the active component to form a protective cap within the metal interconnect, and forming the dielectric diffusion barrier or an etch stop layer, wherein all operations are performed in one apparatus without a vacuum break.

The devices formed using these methods may have improved electromigration properties and also may exhibit greater adhesion at the metal/dielectric diffusion interface.

According to another aspect, a semiconductor device is provided. The semiconductor device includes a region of dielectric material and a region of copper or copper alloy which is embedded in the dielectric material. The device further includes a layer comprising $BN_x$ which is disposed on the layer of dielectric and on the region of copper or copper alloy. The device further comprises a boron-containing cap within the copper or copper alloy region.

According to another aspect, an apparatus for forming a protective cap on or within a metal portion of a partially fabricated semiconductor device, is provided. The apparatus includes: (a) a process chamber having an inlet for introduction of reactants; (b) a wafer support for holding the wafer in position during formation of the protective cap; and (c) a controller comprising program instructions for depositing the protective cap. The instructions include instructions for: (i) depositing a source layer comprising boron or a second metal over exposed portions of metal and dielectric on the wafer substrate; (ii) modifying a top portion of an active component layer to form a passivated layer; and (iii) allowing an active component in the source layer to diffuse into and/or react with the metal on a substrate and to form a protective cap. In some embodiments the apparatus is a PECVD apparatus. The recited operations may be performed sequentially at one station of a multi-station apparatus. In other embodiments, some operations may be performed at a first station of the apparatus, while others may be performed at a different station. One station may be configured for processes performed at a first temperature, while another station may be configured for processes performed at different temperature. For example, deposition of the source layer may be performed at one station of a multi-station apparatus at a first temperature, while subsequent modification of the source layer may be performed at a different temperature at a different station. The substrate may be transferred between the stations without a vacuum break. In other embodiments, the process may be analogously implemented in a multi-chamber apparatus, where the substrate may be transferred between the chambers without exposing the substrate to ambient conditions.

These and other features and advantages of the present invention will be described in more detail below with reference to the associated drawings.

DETAILED DESCRIPTION OF PREFERRED EMBODIMENTS

Introduction and Overview

Electromigration is becoming a significant reliability problem in IC fabrication, as the dimensions of devices continue to decrease, and current densities experienced by interconnects are increasing. Electromigration manifests itself in migration of metal atoms with the current, and in formation of voids within the interconnect. Formation of voids can subsequently lead to device failure. Migration of metal atoms is particularly pronounced at metal/diffusion barrier interfaces and along grain boundaries. Currently, at 90 nm and 45 nm technology nodes, methods for improving electromigration performance are needed. While electromigration performance can be improved by introducing dopant elements into interconnect, such dopants are typically have higher resisitivity than the interconnect metal (e.g., Cu) and can significantly increase interconnect resistance. Thus, uncontrolled doping of interconnect metal can lead to interconnects with unacceptably high resistance.

A method for a controlled introduction of dopants is herein provided. The method involves forming protective caps within the metal interconnect by introducing a controlled amount of dopant to the interconnect. As a result, very thin protective caps can be formed within the upper portion of metal lines, typically, at the interface between metal and dielectric diffusion barrier (or etch stop) layer. The protective caps preferably (but not necessarily) include a solid solution, an alloy, or a compound of the interconnect metal with the dopant. For example, copper can be doped with B, Al, Hf, Ti, Co, Ta, Mo, Ru, Sn, or Sb. These dopants can also be used in combinations with each other or with other elements. In general, a variety of dopants can be used. Dopants capable of forming solid solutions, alloys, and compounds with the interconnect metal, and dopants capable of accumulating at metal/diffusion barrier interfaces and at the grain boundaries within the interconnect are particularly preferred.

While the protective caps described herein and methods for forming such caps are advantageous for improving electromigration performance of interconnects, the use of described devices and processes is not limited to this particular application. For example, protective caps can serve to improve adhesion between metal lines and dielectric diffusion barrier or etch stop layers, and to prevent interconnect metal from oxidation during IC device fabrication.

Formation of protective caps in interconnects will be illustrated in the context of a copper dual Damascene processing. It is understood, that methods disclosed herein can be used in other processing methods, including single Damascene processing, and can be applied to a variety of interconnect metals beyond copper. For example, these methods can be applied to aluminum, gold, and silver-containing interconnects.

Figure 1A:
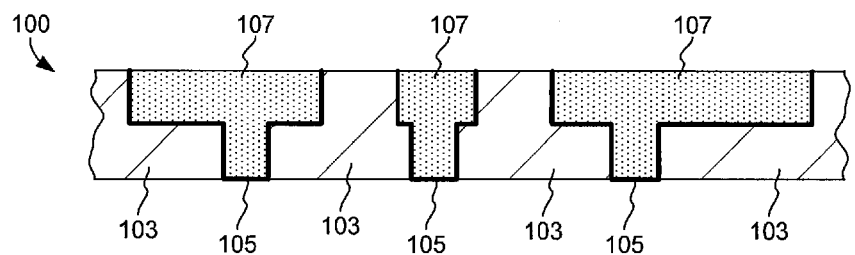
FIGS. 1A-1E show cross sectional depictions of device structures created during a copper dual Damascene fabrication process.

Presented in FIGS. 1A-1D, is a cross sectional depiction of device structures created on a semiconductor substrate at various stages of a dual Damascene fabrication process. A cross sectional depiction of a completed structure created by the dual Damascene process is shown in FIG. 1E. "Semiconductor substrate" as used in this application is not limited to the semiconductor portions of an IC device, but is broadly defined as a semiconductor-containing substrate. Referring to FIG. 1A, an example of a partially fabricated IC structure, 100, used for dual Damascene fabrication is illustrated. Structure 100, as illustrated in FIGS. 1A-1D, is part of a semiconductor substrate, and, in some embodiments, may directly reside on a layer containing active devices, such as transistors. In other embodiments, it may directly reside on a metallization layer or on other layers that incorporate conductive materials, e.g., layers containing memory capacitors.

A layer 103 illustrated in FIG. 1A is a layer of inter-metal dielectric, which may be silicon dioxide but is more typically a low-k dielectric material. In order to minimize the dielectric constant of the inter-metal dielectric stack, materials with a k value of less than about 3.5, preferably less than about 3.0 and often as lower than about 2.8 are employed as inter layer dielectrics. These materials include but are not limited to fluorine or carbon doped silicon dioxide, organic-containing low-k materials and porous doped silicon dioxide materials known to those of skill in the art. Such materials can be deposited, for example, by PECVD or by spin-on methods. Layer 103 is etched with line paths (trenches and vias) in which a partially conductive metal diffusion barrier 105 is deposited, followed by inlaying with copper conductive routes 107. Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or inter-layer dielectric and result in degradation of their properties. Several types of metal diffusion barriers are used in order to protect the dielectric layers of the IC device. These types may be divided into partially conductive metal-containing layers such as 105 and dielectric barrier layers which will be described in further detail with reference to FIG. 1B. Suitable materials for partially conductive diffusion barrier 105 include materials, such as tantalum, tantalum nitride, titanium, titanium nitride and the like. These are typically deposited onto a dielectric layer having vias and trenches by a PVD or an ALD method.

Copper conductive routes 107 can be formed by a number of techniques, including PVD, electroplating, electroless deposition, CVD, etc. In some implementations, a preferred method of forming a copper fill includes depositing a thin seed layer of copper by PVD and subsequently depositing bulk copper fill by electroplating. Since copper is typically deposited with overburden residing in the field region, a chemical mechanical polishing (CMP) operation is needed to remove the overburden and to obtain a planarized structure 100.

Figure 1B:
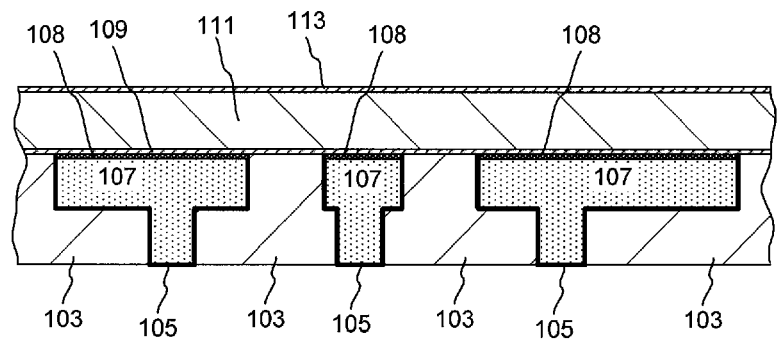

Next, referring to FIG. 1B, after the structure 100 has been completed, the surface of the substrate 100 is pre-cleaned to remove contaminants and metal oxide. After pre-clean, a dopant source layer containing an active component (a dopant-generating component containing boron or metal) is deposited both onto copper lines 107 and onto dielectric 103. The source layer is next converted to a passivated layer, 109, e.g., by nitridation or oxidation of the source layer. For example, the passivated layer may contain $BN_x$, $BO_x$, $AlO_x$, $TiO_x$, etc. The source layer is completely converted to a nonconductive passivated layer over regions of dielectric, to prevent shorting between adjacent metal lines 107. The portion of the source layer residing directly over copper lines 107 is only partially converted to a passivated layer, allowing a portion of unmodified source layer to remain in contact with copper. After the dopant from the unpassivated portion of the source layer is allowed to diffuse into and/or react with copper, protective caps 108 are formed within the top portions of metal lines 107. The thickness of protective caps can be controlled by controlling the amount of material deposited in the source layer, by controlling the degree of modification during partial passivation of the source layer, and by controlling conditions used during diffusion and/or reaction of dopant with copper. Protective caps may include, for example solid solutions or alloys of copper with B, Al, Ti, etc. In some embodiments the amount of dopant in the alloy or solid solution is controlled by controlling the temperature and time used to promote the diffusion of the dopant from the source layer. Compositions of protective caps and of the passivated layer will be described in the following sections in detail.

In some embodiments, the passivated layer also serves as a diffusion barrier layer. In other embodiments, a separate diffusion barrier (or etch stop) layer is deposited on top of the passivated layer. Typically, such diffusion barrier layer includes doped or undoped silicon carbide or silicon nitride.

As depicted in FIG. 1B, the film 109 may include a single passivated layer (e.g., $BN_x$ or $AlO_x$ layer) or a bi-layer consisting of a passivated layer adjacent to copper lines 107 and an upper dielectric diffusion barrier layer (e.g., a doped silicon carbide layer) residing on the passivated layer. Both of these embodiments will be described in detail in subsequent sections with reference to FIGS. 2A-2C. The film 109 will be referred to as a Cu/dielectric interface film or simply as an "interface film".

In the embodiment where the interface film includes a separate dielectric diffusion barrier layer, the dielectric diffusion barrier layer is deposited on top of the passivated layer, typically by a PECVD method. In one embodiment, deposition of a passivated layer, formation of protective caps 108, and deposition of dielectric diffusion barrier layer is performed in one PECVD apparatus without breaking the vacuum. The interface film 109 may also serve as an etch stop during subsequent Damascene processing.

Referring again to FIG. 1B, a first dielectric layer, 111, of a dual Damascene dielectric structure is deposited onto the film 109. This is followed by deposition of an etch stop film 113 by a PECVD method on the first dielectric layer 111. The dielectric layer 111 is typically composed of low-k dielectric materials such as those listed for a dielectric layer 103. Note that layers 111 and 103 need not necessarily have identical composition.

Figure 1C:
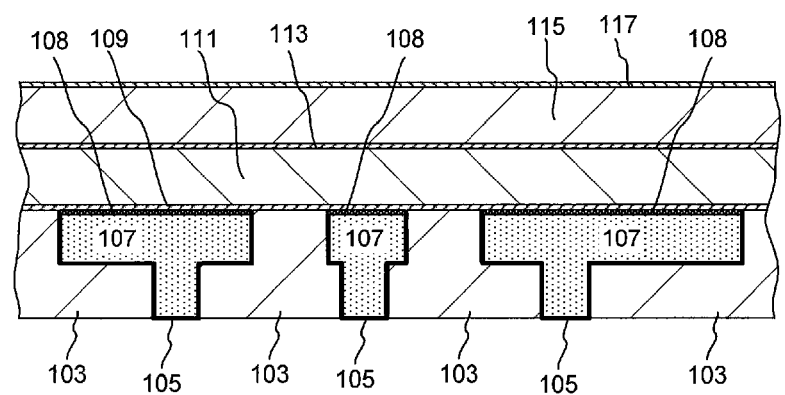

The process follows, as depicted in FIG. 1C, where a second dielectric layer 115 of the dual Damascene dielectric structure is deposited in a similar manner to the first dielectric layer 111, onto an etch-stop film 113. Deposition of an anti-reflective layer (not shown) and a CMP stop film 117 follows. Second dielectric layer 115 typically contains a low-k dielectric material such as those described above for layers 103 and 111. A CMP stop film 117 serves to protect the delicate dielectric material of inter-metal dielectric (IMD) layer 115 during subsequent CMP operations. Typically, a CMP stop layer is subject to similar integration requirements as a diffusion barrier and etch stop films 109 and 113, and can include materials based on silicon carbide or silicon nitride.

Figure 1D:
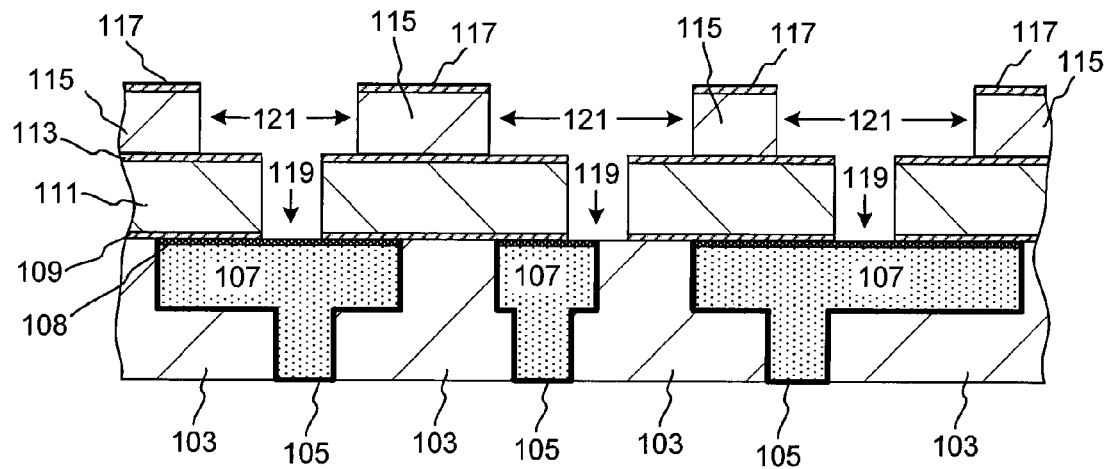
Figure 1E:
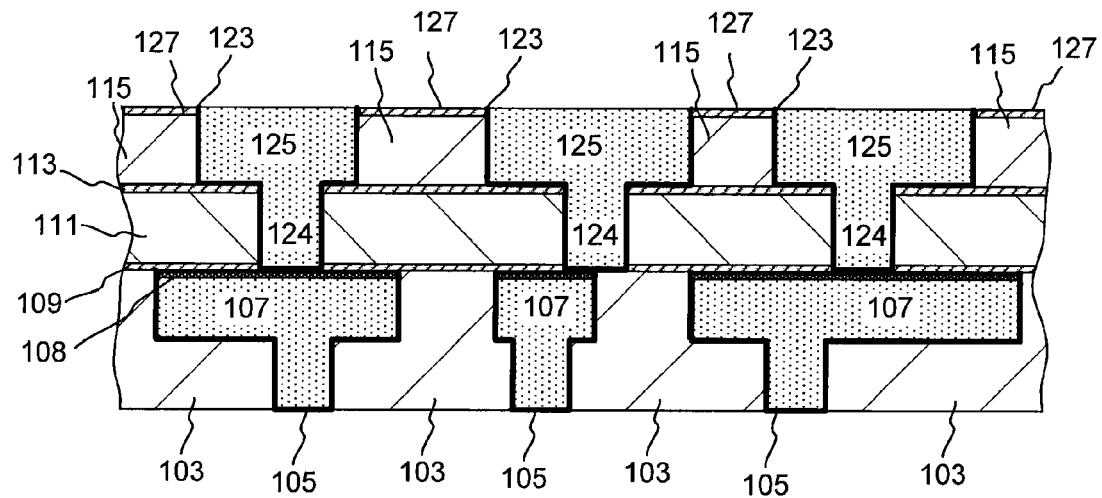

The dual Damascene process continues, as depicted in FIGS. 1D-1E, with etching of vias 119 and trenches 121 in the first and second dielectric layers. Standard lithography techniques are used to etch a pattern illustrated in FIG. 1D. A trench-first or a via-first methods well known by those of skill in the art may be employed.

Next, as depicted in FIG. 1E, these newly formed vias and trenches are, as described above, coated with a metal diffusion barrier 123, which may contain barrier materials, such as tantalum, tantalum nitride, titanium nitride or other materials that effectively block diffusion of copper atoms into the dielectric layers.

After the diffusion barrier 123 has been deposited, a seed layer of copper is applied (typically by a PVD process) to enable subsequent electrofilling of the features with copper inlay. The copper layer is deposited e.g., by electrofill, and excess of metal deposited in the field is removed in a CMP operation, performed such that CMP stops at the CMP stop film 117. FIG. 1E shows the completed dual Damascene process, in which copper conductive routes 124 and 125 are inlayed (seed layer not depicted) into the via and trench surfaces over barrier 123. FIG. 1E illustrates three interconnects, where copper lines have been doped in a controlled fashion.

If further processing is required, an interface film similar to film 109 and protective caps similar to caps 108 are formed on top of the structure depicted in FIG. 2E, and deposition of a new metallization layer follows.

Structure and composition of the protective caps 108 and of the interface layer 109 will now be illustrated in detail with reference to FIGS. 2A-2C.

Device Structures

Figure 2A:
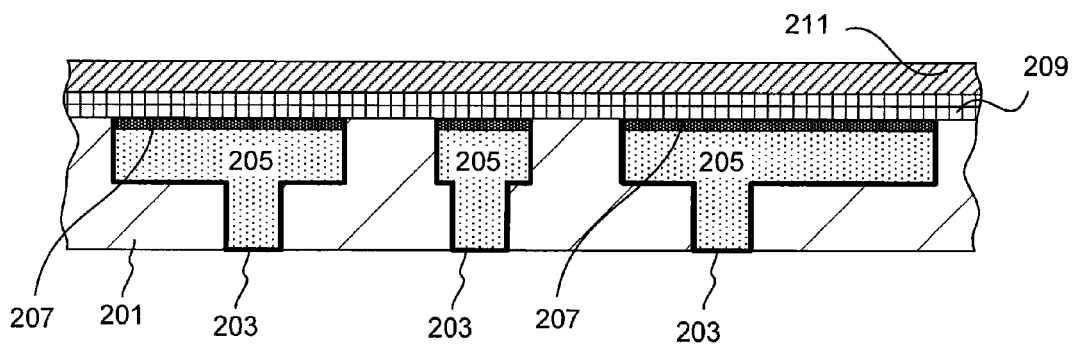
FIGS. 2A-2C show cross sectional depictions of partially fabricated device structures illustrating protective caps.
Figure 2B:
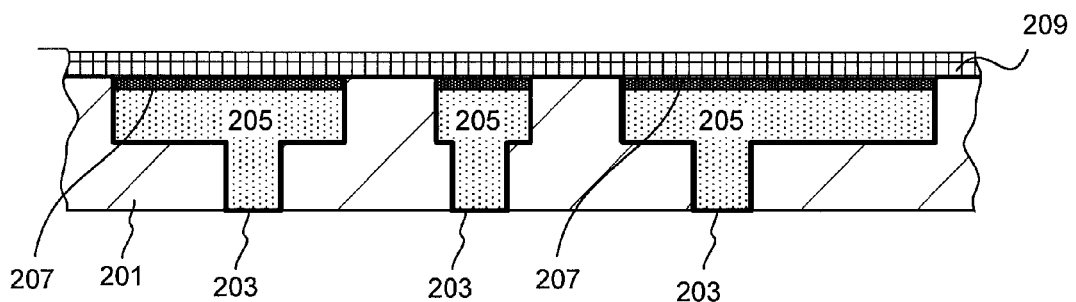

Referring to FIG. 2A, an example cross-sectional depiction of a partial IC structure is illustrated. In this device, vias and trenches formed in an inter-layer dielectric 201, are lined with a diffusion barrier material 203 and are filled with copper or copper alloy 205. The top portions of copper lines 205 include thin protective caps 207, residing at the interface between copper lines 205 and the passivated layer 209. The passivated layer 209 resides both on the ILD layer 201 and on the protective caps 207, and is in contact with both of these layers. A dielectric diffusion barrier or an etch stop layer 211 resides on top of the passivated layer 211. While it is not shown to preserve clarity, another ILD layer resides on top of the dielectric diffusion barrier or etch stop layer 211. The passivated layer 209 and the diffusion barrier (or etch stop) layer 211 together constitute the interface film (as was illustrated by layer 109 with reference to FIG. 1B), which resides at the metal/ILD boundary.

In one embodiment, inter-layer dielectric layer 201 has a thickness of between about 1,000-10,000 Å. Layer 201 can include a variety of ILD materials, such as low-k, and ultra low-k dielectrics known to those of skill in the art. For example, carbon-doped silicon oxide, or organic dielectric materials with k less than about 2.8 may be used. A copper line 205 can have a thickness of between about 500-10,000 Å, of which preferably no more than about 10%, more preferably no more than about 2% is occupied by the protective cap, as measured by layer thickness. It is understood that the protective caps, in many embodiments, will have graded compositions, with the concentration of dopant being greatest at the passivated layer interface. The allowable thickness for the protective cap will depend on the resistivity of the dopant. In general, the protective caps are formed, in accordance with the described methods, such that a resistance shift of a via is less than about 10%, preferably less than about 5%, and even more preferably less than about 3%. The resistance shift is measured as a difference in resistance of an interconnect without a cap versus a resistance of a capped interconnect. In some embodiments, the allowable resistance shifts, are achieved by forming protective caps with thicknesses not exceeding 500 Å, and preferably not exceeding 100 Å.

It is understood that different dopants can diffuse differently within copper interconnects, and can affect interconnect resistance to a different extent. Therefore, the numerical values provided above serve as one example, and are not intended to limit the structures to the thickness parameters mentioned. For example, certain dopants may diffuse into copper interconnect to deposit over the entire copper line, without forming a distinct cap, or to accumulate at the grain boundaries and/or to accumulate at other interfaces, e.g., at the interfaces of copper layer 205 with a diffusion barrier 203. Advantageously, the provided methods allow introduction of such dopants in a controlled amount, such that interconnect resistance is controlled, even though the layer thickness may not be accurately defined in these cases.

A number of doping elements can be used in protective caps. The preference is given to those dopants which form solid solutions, alloys, or compounds with copper, and to the dopants which can accumulate at copper grain boundaries and at interfaces of copper with other layers. Materials having relatively low resistivity, such as metals are often preferred. Further, materials which do not easily diffuse into copper at low temperatures (e.g., at temperatures of less than about 100° C. are also often preferred. Examples of suitable dopants include but are not limited to B, Al, Hf, Ti, Co, Ta, Mo, Ru, Sn, and Sb. In general, it is desired that the selected dopant has a volatile precursor, such that deposition could be performed by CVD methods. Therefore, metal dopants which have volatile hydrides, carbonyls, halides, and organometallic precursors are typically preferred. Compounds which can be introduced in gas phase at temperatures of up to 450° C. and pressures of greater than about 1 Torr can be suitable precursors.

In specific embodiments, the protective cap 207 comprises copper and boron, or copper and aluminum, or copper and titanium. In some embodiments, dopants are used in combination with each other. For example the protective cap 207 may include copper, aluminum, and titanium, or other combination of copper with dopants. In some embodiments, the dopants described above are used in combination with materials used for forming protective self-aligned buffer (PSAB) layers, e.g., materials such as $CuSi_x$, $CuGe_x$, $SiN_x$, and $SiC_x$, etc. Such layers are described in detail in commonly owned U.S. patent application Ser. No. 11/726,363, titled "Protective Self-aligned Buffer Layers for Damascene Interconnects" filed Mar. 20, 2007, naming Yu et al. as inventors, in U.S. patent application Ser. No. 11/709,293, titled "Protective Self-aligned Buffer Layers for Damascene Interconnects" filed Feb. 20, 2007, naming Chattopadhyay et al. as inventors, and in U.S. patent application Ser. No. 10/980,076 filed Nov. 3, 2004, titled "Protection of Cu Damascene Interconnects by Formation of a Self-aligned Buffer Layer," naming van Schravendijk et al. as inventors, which all are incorporated herein by reference in their entireties and for all purposes.

A passivated layer 209 residing on top of both the ILD layer 201 and on top of protective caps 207, in one embodiment, has a thickness of between about 50-500 Å. The passivated layer typically contains a non-conductive material which prevents shorting between adjacent interconnects. The passivated layer typically contains modified dopant, e.g., it can contain nitrides, oxides, carbides, sulfides, selenides, phosphides, and arsenides of the dopant (boron or metal). Further, the passivated layer may contain hydrocarbons $C_xH_y$. In one embodiment, the passivated layer contains $BN_x$. The $BN_x$ layer can also include hydrogen and, in some embodiments, other elements. In another example, the passivated layer contains metal oxides, such as $AlO_x$, $HfO_x$, $TiO_x$, $CoO_x$, $TaO_x$, $MoO_x$, $RuO_x$, $SnO_x$, and $SbO_x$.

As shown in FIG. 2A a dielectric diffusion barrier or etch stop layer 211 is residing on top of the passivated layer. The layer 211, in one embodiment, has a thickness of between about 50-500 Å. Conventionally, silicon nitride, and nitrogen-doped silicon carbide (NDC) were used for this application. Currently, materials with lower dielectric constants than silicon nitride are often used as dielectric diffusion barriers. These materials include carbon-rich silicon carbide materials, such as those described in commonly assigned U.S. patent application Ser. No. 10/869,474 by Yu et al., filed on Jun. 15, 2004; boron-doped silicon carbide materials described in U.S. patent application Ser. No. 10/915,117 by Yu et al., filed on Aug. 9, 2004 and in U.S. patent application Ser. No. 11/373,847 by Yu et al. filed on Mar. 8, 2006; and oxygen-doped silicon carbide materials, e.g., described in U.S. Pat. No. 6,855,645 by Tang et al. issued on Feb. 15, 2005. All patent applications that were mentioned in this paragraph are hereby incorporated by reference for all purposes and in their entireties. In some embodiments layer 211 may contain several sub-layers, e.g., sub-layers containing doped silicon carbide having different compositions tailored for improved diffusion barrier and etch stop properties.

In the embodiment illustrated by FIG. 2A, layers 209 and 211 together form an interface layer residing between two ILD layers (the top ILD layer is not shown).

In certain embodiments, the passivated layer 209 may serve as a diffusion barrier or an etch stop layer without the need for a separate silicon carbide or silicon nitride layer 211. In this embodiment, illustrated by FIG. 2B, the interface layer residing between two ILD layers consists only of the passivated layer 209. For example, certain metal oxides and metal nitrides may serve as an etch stop or a diffusion barrier layer.

Figure 2C:
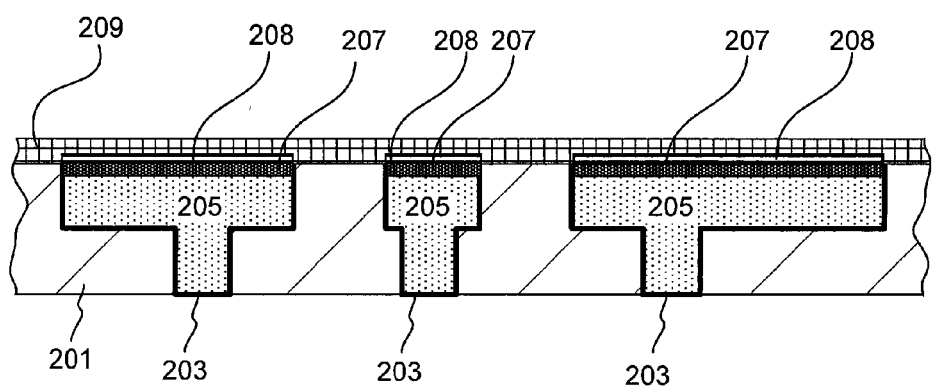

FIG. 2C illustrates an embodiment, in which a layer of dopant or a dopant-generating compound 208 resides between the protective cap 207 and the passivated layer 209, and is in contact with these two layers. The layer 208 is aligned over the copper line 205 and does not extend over the layer of dielectric. 201. The layer 208 may include pure dopant or a dopant-generating compound. For example layer 208 can include $BH_x$, Al, Ti, Ta, Hf, Ru, etc. The metals in this layer may be free or may be bonded with other elements, such as H, C, N, etc. In some embodiments, copper may diffuse upwards to layer 208, forming an alloy, mixture or solid solution with the dopants in layer 208. In these embodiments the 207/208 bi-layer will serve as a protective cap. In general, the protective cap, as described herein, may reside entirely within copper line at the same level as surrounding dielectric 201, or can include a portion residing above the level of surrounding dielectric 201.

In one specific example the device has a structure as shown in FIG. 2A, with a boron-doped protective cap 207, and a passivated layer 209 containing $BN_x$. The copper line 205 resides in a layer of ULK dielectric (k of about 2.5) having a thickness of about 3,500 Å. The protective cap 207 includes copper and boron and has a thickness of about 100 Å. The protective cap resides at the top of the copper line at its interface with the passivated layer. The passivated layer has a thickness of about 150 Å and includes $BN_x$. The passivated layer may also include hydrogen, and will be referred in the experimental section as the $(BNH)_x$ layer. A layer of diffusion barrier 211 may include nitrogen-doped silicon carbide, oxygen-doped silicon carbide or undoped silicon carbide. The layer 211 has a thickness from 100 Å to 500 Å.

In another specific example the device has a structure as shown in FIG. 2A, with a titanium protective cap 207, and a passivated layer 209 containing $TiN_x$. The copper line 205 resides in a layer of ULK dielectric (k of about 2.5) having a thickness of about 3,500 Å. The protective cap 207 includes copper and titanium and has a thickness of about 100 Å. The protective cap resides at the top of the copper line at its interface with the passivated layer. The passivated layer has a thickness of about 150 Å and includes $TiN_x$. The passivated layer may also include hydrogen. A layer of diffusion barrier 211 may include nitrogen-doped silicon carbide, oxygen-doped silicon carbide or undoped silicon carbide. The layer 211 has a thickness from 100 Å to 500 Å.

In another specific example, the device has a structure as shown in FIG. 2A, with an aluminum-doped protective cap 207. The copper line 205 resides in a layer of ULK dielectric (k of about 2.5) having a thickness of about 3,500 Å. The protective cap 207 includes copper and aluminum and has a thickness of about 100 Å. The protective cap resides at the top of the copper line at its interface with the passivated layer. The passivated layer has a thickness of less than about 100 Å and essentially consists of $AlO_x$. A layer of diffusion barrier 211, having a thickness of about 100 Å to 500 Å, resides in contact with $AlO_x$ and may include nitrogen-doped silicon carbide, oxygen-doped silicon carbide or undoped silicon carbide.

Methods for Forming Protective Capping Layers

Figure 3A:
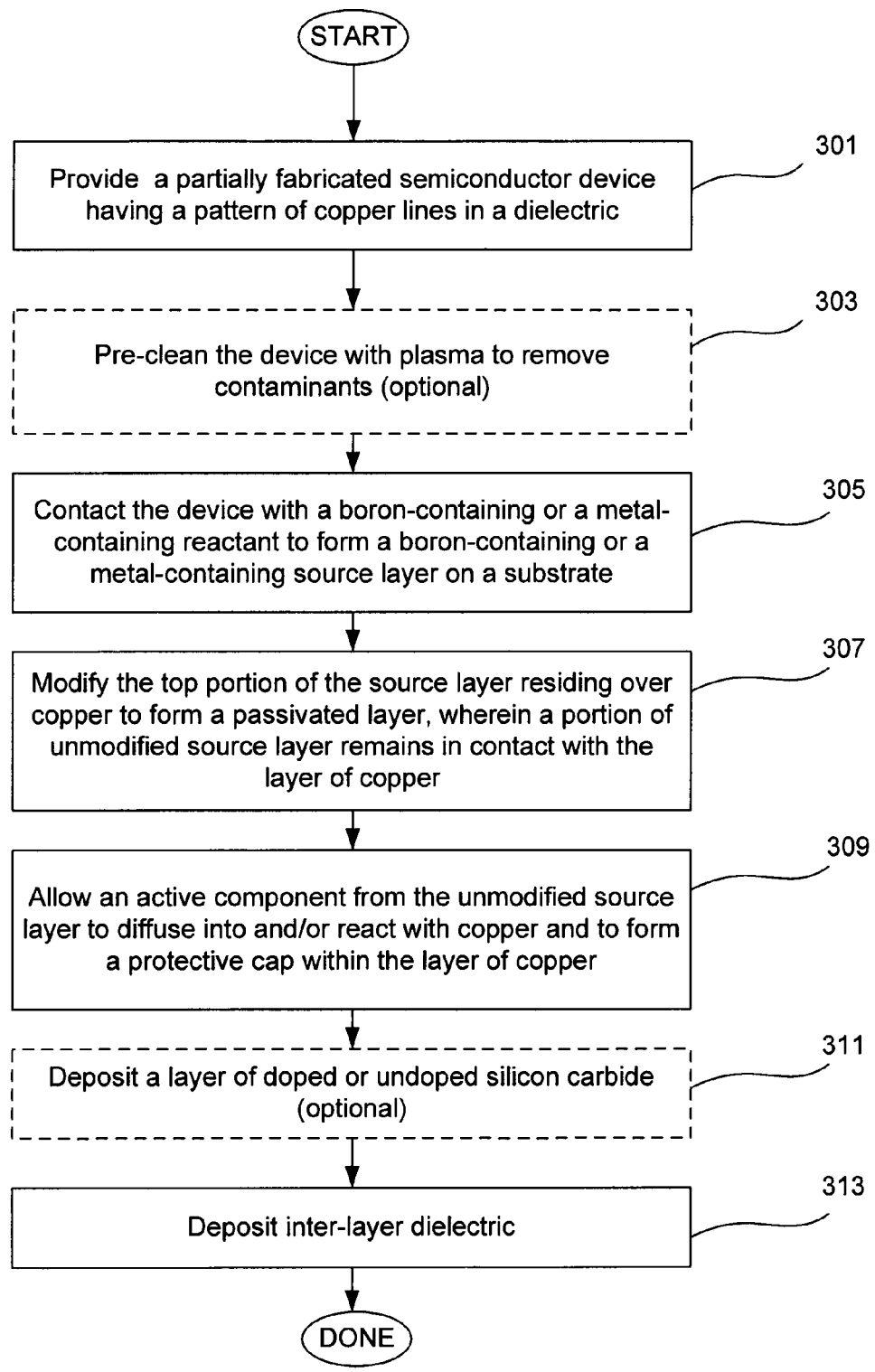
FIG. 3A presents an example process flow diagram of a cap-forming process according to some embodiments.

An exemplary method for forming protective capping layers is illustrated by a process flow diagram shown in FIG. 3. Cross-sectional views of device structures obtained at various stages of this process are shown in FIGS. 4A-4E. While the methods described herein may be practiced in many types of apparatus, in some embodiments plasma enhanced chemical vapor deposition (PECVD) apparatus is preferred. In some embodiments, the PECVD apparatus is capable of providing high frequency (HF) and low frequency (LF) plasma generating sources.

Referring to FIG. 3, the process starts by providing a partially fabricated semiconductor device having a pattern of copper lines in a dielectric, as shown in operation 301. For example, a device, such as one shown in FIG. 4A may be used. The device has a layer of copper or copper alloy 405 embedded in a layer of dielectric 401. A thin layer of diffusion barrier material (containing, e.g., Ta, $TaN_x$, $TiN_x$, Ru, W) is residing at the interface between copper and dielectric. A layer of copper and a layer of dielectric are exposed at the substrate surface.

The substrate is optionally pre-cleaned in an operation 303 to remove contaminants from its surface. For example, the substrate may be pre-cleaned by exposing it to a reducing gas in a plasma (e.g., to $H_2$ or $NH_3$ in a plasma discharge) in order to remove copper oxide from copper surface. In some embodiments pre-clean with $H_2$ plasma has provided devices with particularly improved characteristics. The process gas during pre-clean can also include a carrier gas, such as $N_2$, He, Ar, etc. In one example, pre-clean is performed in a PECVD chamber at a temperature of about 200-400° C., pressure of about 1.5-4 Torr and an $H_2$ flow rate of about 4,000-10,000 sccm. The plasma, which may contain an HF and an LF component is ignited and is sustained at a total power of 200-1000 W per one 300 mm wafer. In some embodiments, it is preferable to use HF power at 0.1-1.5 W/cm$^2$ and LF power at 0-0.8 W/cm$^2$ during the pre-clean operation. In another example, $NH_3$ is used instead of $H_2$ as a reducing gas, and is flowed into the process chamber at a flow rate ranging from about 6,000 to 8,000 sccm. An $N_2$ carrier gas is flowed into the chamber at a flow rate of about 2,000-4,000 sccm. The pre-cleaning treatment can last several seconds, e.g., between about 6-20 seconds.

After the pre-clean is completed, a source layer of dopant-containing material is deposited onto the substrate surface in operation 305. Advantageously, the dopant-containing material does not need to selectively deposit onto the metal surface, and may be deposited both onto the surface of dielectric and onto metal. The source layer is deposited by contacting the partially fabricated device with a dopant-containing reactant (e.g., with a boron-containing or a metal-containing reactant) under conditions that result in a deposition of a dopant-containing (e.g., boron-containing or metal-containing) source layer.

In one embodiment, the dopant-containing source layer is deposited thermally without a plasma discharge. For example, a volatile precursor, such as a volatile hydride, halide, carbonyl, or an organometallic compound can react (e.g., decompose) at high temperature to deposit a layer of dopant-containing material on a substrate surface. The temperature range, the substrate exposure time, and other deposition conditions are tuned for each particular precursor, as will be understood by those of skill in the art.

In one embodiment, $B_2H_6$ is used as a precursor to form a B-doped protective cap. In one example process, $B_2H_6$ is introduced into the process chamber together with one or more additional carrier gases, such as $N_2$, $O_2$, $CO_2$, He, $NH_3$, Ar, etc. The $B_2H_6$ concentration, in this example, ranges from about 0.5 to about 20%, and the pressure ranges from about 0.5 Torr to about 10 Torr. The $B_2H_6$ contacts the substrate at a chamber temperature of between about 200-400° C. in the absence of a plasma discharge, resulting in deposition of boron-containing layer on a substrate. It was determined that this layer contains B—H bonds, and will be referred to as a $BH_x$ layer. The $BH_x$ layer serves as a source of B dopant which diffuses into copper line and forms the protective cap.

In another example, a volatile metal-containing precursor is introduced into the chamber. Organometallic compounds, metal hydrides, metal halides, and metal carbonyls may serve as suitable precursors. For example, alkyl-substituted metal derivatives and cyclopentadienyl-substituted metal derivatives may be used The precursor reacts at high temperature to form a metal-containing source layer on a substrate. In some embodiments, pressure and temperature ranges similar to those used in deposition of B-containing caps may be used. In general, depending on the nature of the precursor, the deposition conditions are optimized to deposit the metal-containing source layer with the best qualities. For example, the temperature range may be optimized to favor a particular decomposition mechanism for a precursor, and thereby tuning the composition of metal-containing source layer, as desired. One of skill in the art will understand how to optimize deposition conditions and to obtain the metal-containing source layers with optimized composition.

As it was mentioned, a variety of metals can serve as dopants. For example copper lines may be doped with Al, Hf, Ti, Co, Ta, Mo, Ru, Sn, and Sb. Other metals, for which volatile precursors are known may be used. Examples of precursors suitable for depositing aluminum-containing source layers include but are not limited to trimethylaluminum, dimethylaluminum hydride, triethylaluminum, tri-isobutylaluminum, and tris(diethylamino)aluminum. Examples of precursors that can be used for depositing source layers containing other metals include but are not limited to bis(cyclopentadienyl)cobalt, cobalt(II) acetylacetonate, tetrakis(dimethylamido)hafnium, tetrakis(diethylamido)hafnium, tetrakis(dimethylamido)molybdenum, tetrakis(dimethylamino)titanium (TDMAT), tetrakis(diethylamino)titanium (TDEAT), tetrakis(ethylmethyl amido)titanium, bis(diethylamino)bis(diisopropylamino)titanium, pentakis(dimethylamino)tantalum, tert(butylimidotris)(diethylamido)tantalum (TBTDET), pentakis(diethylamido)tantalum, bis(ethylcyclopentadienyl)ruthenium, tris(dimethylamido)antimony, and tetramethyltin.

The source layer does not necessarily need to contain pure elemental dopant, but may include compounds of dopant with other elements, e.g., H, C, N, etc. The dopant, however, can be easily generated from such layers and, once generated, is capable of diffusing into and/or reacting with copper. In other embodiments, however, the source layer may contain substantially pure metal or boron.

Figure 4A:
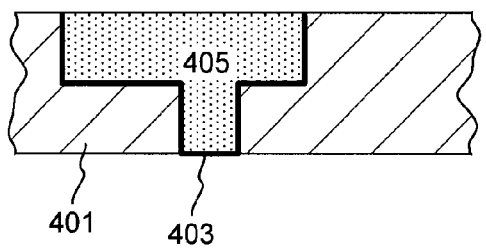
FIGS. 4A-4E show cross sectional depictions of device structures created during formation of capping layers, according to some embodiments.
Figure 4B:
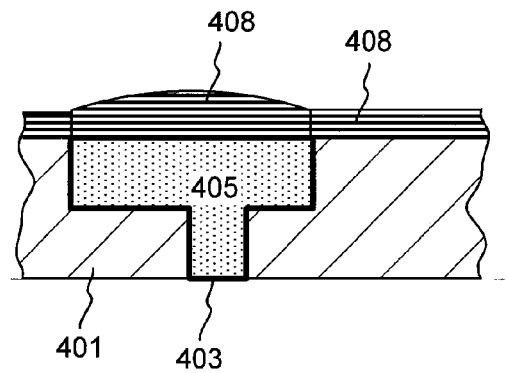
Figure 4C:
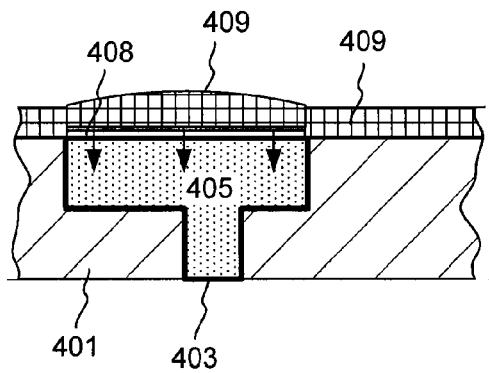

The source layer does not need to be selectively deposited exclusively on top of the copper line, but may be deposited both on top of the dielectric layer and on top of copper. In many embodiments, however, some degree of selectivity between copper and the dielectric is achieved, and a thicker source layer is formed over the copper line, as illustrated in FIG. 4B, where the source layer 408 (which may be a $BH_x$ layer or a metal-containing-layer) has a greater thickness over the copper line 408 than over the layer of dielectric 401. It is understood, that depending on particular precursor and deposition conditions, a wide variety of selectivities may be achieved ranging from an entirely selective deposition of the source layer onto copper line, to an entirely non-selective process where the source layer is deposited to an equal thickness on both copper and dielectric. While the methods described herein can be used for controlled introduction of dopants from both selectively and non-selectively deposited source layers, the methods are herein illustrated using layers deposited with partial selectivity as an example. Such partial selectivity, characterized by a greater thickness of the source layer deposited on the copper line compared to the thickness of the source layer deposited on the dielectric, can be observed both for boron-containing and for many metal-containing source layers. In some embodiments, the thickness of the source layer residing on copper is between about 10-500% greater than the thickness of the source layer residing on dielectric.

Referring again to the process flow diagram shown in FIG. 3, after the source layer has been formed in operation 305, in the subsequent operation, 307, the top portion of the source layer residing over copper is modified to form a passivated layer, while a portion of the unmodified source layer remains in contact with the layer of copper. This is illustrated by a structure shown in FIG. 4C, where only a small portion of the source layer 408 remains unmodified and in contact with copper line 405, while the top portion of the source layer residing over copper is converted to form the passivated layer 409. The portion of the source layer residing over dielectric is entirely converted to a passivated material. The passivation operation 309 serves two purposes. First, it helps control the interconnect resistance, because partial passivation of a source layer limits the amount of available dopant. Preferably, the passivated layer contains materials which cannot easily diffuse from the passivated material into copper line. For example boron is converted to boron nitride; aluminum is converted to aluminum oxide, etc. While free boron and aluminum are capable of diffusing into copper line, when converted to nitrides and oxides, these materials are trapped within the passivated layer, and are not capable of entering the copper line and increasing its resistivity. Because the top portion of the source layer is modified to a passivated layer, the amount of dopant introduced into copper line is determined by the thickness of the unmodified portion of the source layer remaining in contact with the copper line. Depending on the amount of dopant that needs to be introduced into the line, larger or smaller amount of the source layer may be converted to a passivated layer. For example, the thickness of the initially deposited source layer can range between about 50-500 Å, of which between about 20-60% can be converted to a passivated layer.

Passivation is also needed in those embodiments where the source layer contains conductive materials that are deposited both over copper and dielectric. In these embodiments, passivation converts the conductive material (e.g., metal) to a material with little or no conductivity, thereby preventing shorting between adjacent copper lines. For example partially conductive $BH_x$ source layer residing on dielectric can be completely converted on a dielectric to a passivated layer containing $BN_x$ which is essentially non-conductive. Similarly, a source layer containing aluminum can be converted to a non-conductive aluminum oxide.

A number of compounds, such as, nitrides, oxides, sulfides, selenides, tellurides, phosphides, and carbides, are suitable materials for a passivated layer. Of these, nitrides and oxides are preferred in many embodiments.

The passivated layer can be formed by contacting the dopant-containing source layer with an appropriate reagent, that is capable of modifying the source layer material to a passivated material. While in some embodiments, such modification can be performed thermally (without the use of plasma), it is often preferred to modify the source layer in a plasma discharge. For example, nitridation can be performed by contacting the substrate with a nitrogen-containing reactant (such as $N_2$, $NH_3$, $N_2H_4$, an amine, etc.) in a plasma. Oxides can be similarly formed by contacting the introducing oxygen-containing reactants (such as $O_2$, $CO_2$, $N_2O$, etc) in a plasma. Sulfides, selenides, tellurides, phosphides, and carbides can be similarly formed by exposing the substrate to a reactant containing a required element, e.g., $H_2S$, $H_2Se$, $H_2Te$, $PH_3$, $C_xH_y$, respectively.

Referring again to FIG. 4C, it can be seen that the passivated layer 409 (containing, e.g., $BN_x$, $AlO_x$, $TiO_x$, etc.) is residing over the layer of dielectric 401 and over the layer of copper 405. A thin layer 408 containing the unmodified dopant source resides between the copper line and the layer of passivated material.

Figure 4D:
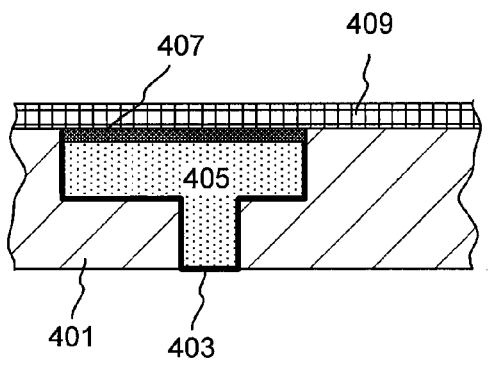

After the passivated layer is formed, an active component (dopant) from the unmodified source layer is allowed to diffuse into and/or react with copper and to form a protective cap within the layer of copper, in an operation 309. This is illustrated by arrows in the structure shown in FIG. 4C. The resulting structure is shown in FIG. 4D, where a protective cap 407 has been formed within the upper portion of the copper line. In this example, the dopant from the source layer 408 has migrated into copper line in its entirety. In other embodiments, a portion of the dopant may remain within the source layer. Yet in other embodiments, the dopant may diffuse into the copper layer, concurrently with copper diffusing into the unmodified source layer. In the latter two cases the protective cap may reside both within and on top of the initially presented copper line (as was illustrated in FIG. 2C).

Formation of the protective cap can occur under a variety of conditions, which may depend on a specific dopant source residing in the unmodified source layer. In some embodiments the dopant-containing material residing within the source layer may not readily diffuse into or react with copper. In these embodiments the dopant may be first generated, by e.g. exposing the substrate to high temperature. In other embodiments, the diffusion and/or reaction of dopant is also promoted by heating the substrate. In some embodiments, the thickness of the protective cap can be controlled by controlling the time of the substrate exposure to high temperature, and the temperature of exposure itself. In some embodiments, formation of protective cap is promoted by heating the substrate to a temperature of at least about 100° C. for a predetermined period of time, e.g., for about 0.25-60 minutes.

Figure 4E:
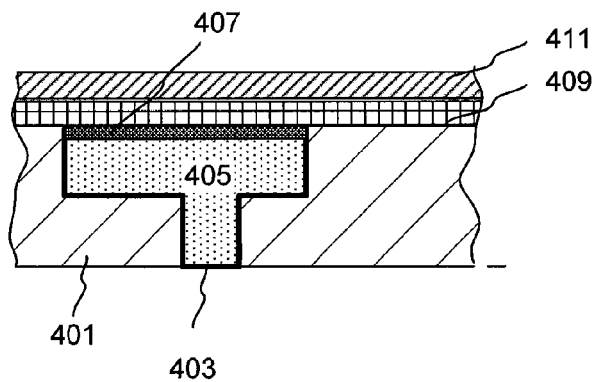

Upon formation of the protective cap, a layer of doped or undoped silicon carbide is deposited in an operation 311. The resulting structure is shown in FIG. 4E. It can be seen that silicon carbide layer 411 is deposited on top of the passivated layer 409 over copper lines and over the dielectric region. The layer of silicon carbide serves as an etch stop or a dielectric diffusion barrier layer and is typically deposited to a thickness of about 100-500 Å. The layer of silicon carbide can be deposited by CVD (preferably by PECVD), for example, by exposing the substrate to silicon-containing and carbon-containing precursors in a plasma discharge. For example, silane, alkylsilanes, and hydrocarbons may be used as precursors. When doped silicon carbide is deposited, the dopant-containing precursor is additionally introduced into the process chamber. For example, $CO_2$, $O_2$ or $N_2O$ may be added during deposition of oxygen-containing silicon carbide, $B_2H_6$ may be added to deposit boron-doped silicon carbide, $NH_3$ and $N_2$ may be added to deposit nitrogen-doped silicon carbide, etc. In other embodiments, doped or undoped silicon nitride is deposited on top of the passivated layer to serve as an etch stop or diffusion barrier layer. In some embodiments deposition of a dielectric diffusion barrier layer is performed at a temperature that is higher than the temperature used in the formation of capping layer (including formation of the source layer and passivation). For example, in some embodiments, formation of protective caps is implemented at a temperature under 350° C., e.g., at about 200-350° C., while diffusion barrier deposition is performed at a temperature of at least about 350° C., e.g., 375-450° C.

It is noted that in some cases, deposition of a dielectric diffusion barrier or an etch stop layer is optional, because the passivated layer itself may have suitable properties to serve as a diffusion barrier or an etch stop. For example, passivated layer containing certain metal oxides may serve as a diffusion barrier layer, eliminating the need for deposition of a separate silicon carbide layer.

The process depicted in FIG. 3 proceeds to a subsequent operation 313, in which an inter-layer dielectric (such as silicon dioxide, organosilicon glass, a porous organic dielectric, etc.) is deposited. The dielectric is deposited either onto the diffusion barrier or an etch stop layer (e.g., onto a silicon carbide layer) or directly onto the passivated layer, if the passivated material has adequate properties for serving as a diffusion barrier. The dielectric can be deposited by PECVD or by spin-on methods and is typically deposited to a thickness of between about 3,000-10,000 Å. The Damascene process may then follow further as depicted in FIGS. 1C-1E.

It is understood, that a process illustrated by the flow diagram shown in FIG. 3 is exemplary only, and that various modifications of this process may be implemented. For example, the various operations of the process shown in FIG. 3 may be performed in a different order. Specifically, introduction of the active component (dopant) into the copper layer can be performed at different times during the process. In some embodiments, generation and diffusion of the dopant may be initiated after the etch stop or diffusion barrier layer has been deposited. In some embodiments, diffusion of dopant is promoted in a post-treatment after an ILD layer has been formed. Often, this operation, is performed by heating the substrate to a temperature of at least about 100° C. In yet other embodiments, the active component (dopant) may diffuse into and/or react with copper before the source layer is passivated. The amount of introduced dopant can be controlled in this embodiment by controlling the time of contact of the unmodified source layer with copper and/or by controlling the temperature of the process.

The methods described above are capable of providing interconnects with controllable resistance and with improved electromigration characteristics. The thickness of protective capping layers formed by these methods can range from about 10 Å to 10,000 Å. It is especially advantageous that these methods provide control over thickness of capping layers in the range of about 10-100 Å, particularly at a 10-60 Å range. Capping films ranging in thickness from about 10-60 Å can provide interconnects with particularly small resistance shifts of less than 1% and less than 3%, that are currently demanded in the IC industry.

Apparatus

In general, formation of protective caps can be performed in any type of apparatus which allows for introduction of volatile precursors, and is configured to provide control over reaction conditions, e.g., chamber temperature, precursor flow rates, exposure times, etc. It is often preferred to perform operations 301-311 without exposing the substrate to ambient environment, in order to prevent inadvertent oxidation and contamination of the substrate. In one embodiment, operations 301-311 are performed sequentially in one module without breaking the vacuum. In some embodiments, operations 301-311 are performed in one CVD (preferably PECVD) apparatus having multiple stations within one chamber, or having multiple chambers. VECTOR™ PECVD apparatus available from Novellus Systems, Inc of San Jose, Calif. is an example of a suitable apparatus.

An exemplary apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing the source layer and etch stop layer deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD system may be used. In even more preferred embodiments the PECVD system includes a LF RF power source.

Figure 5:
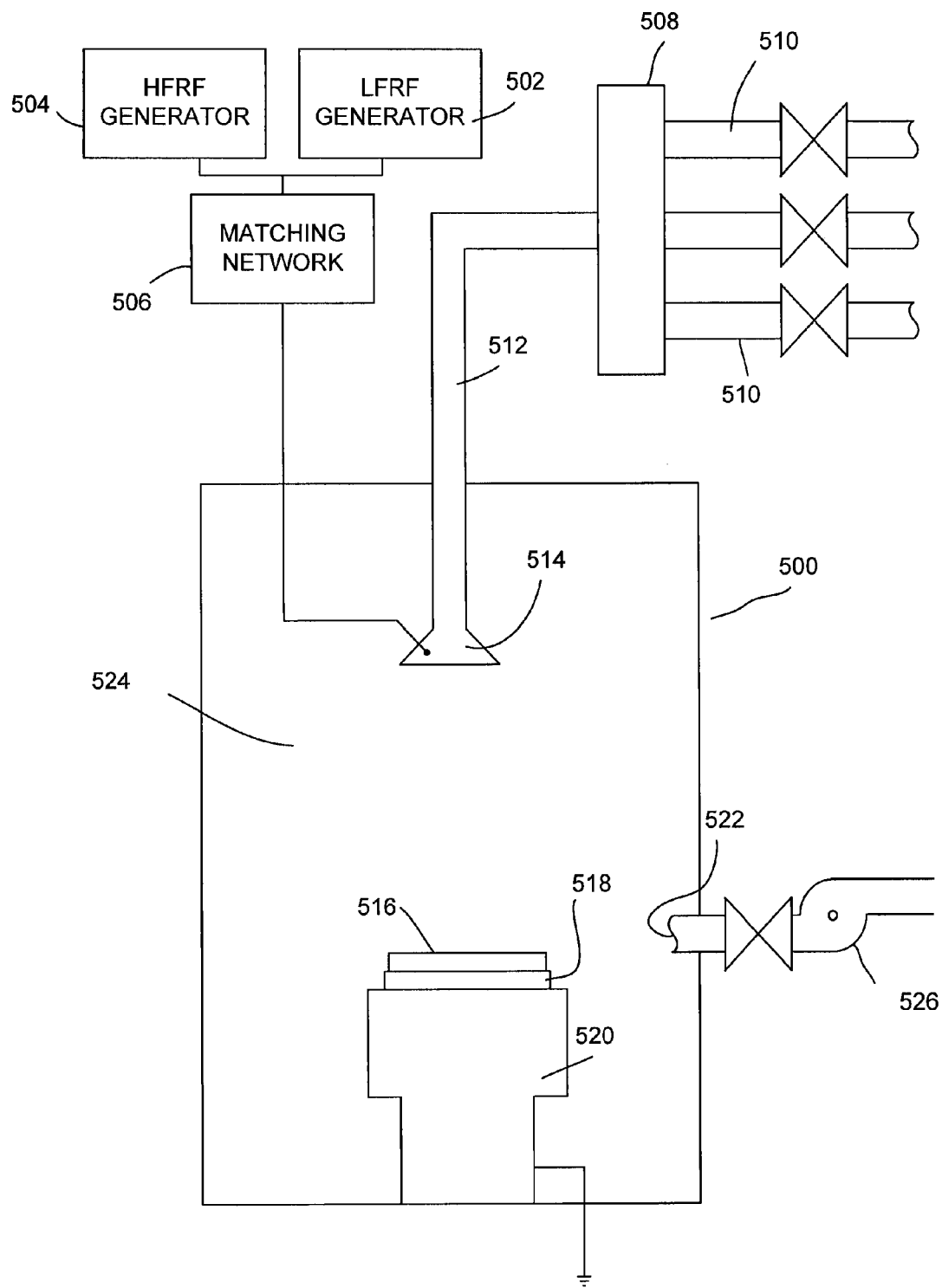
FIG. 5 is a schematic representation of a PECVD apparatus capable of using low frequency (LF) and high frequency (HF) radio frequency plasma sources that can be used for forming capping layers in accordance with some embodiments of present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and a low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the pre-cleaning, formation of the source layer, formation of the passivated layer and doping phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 6:
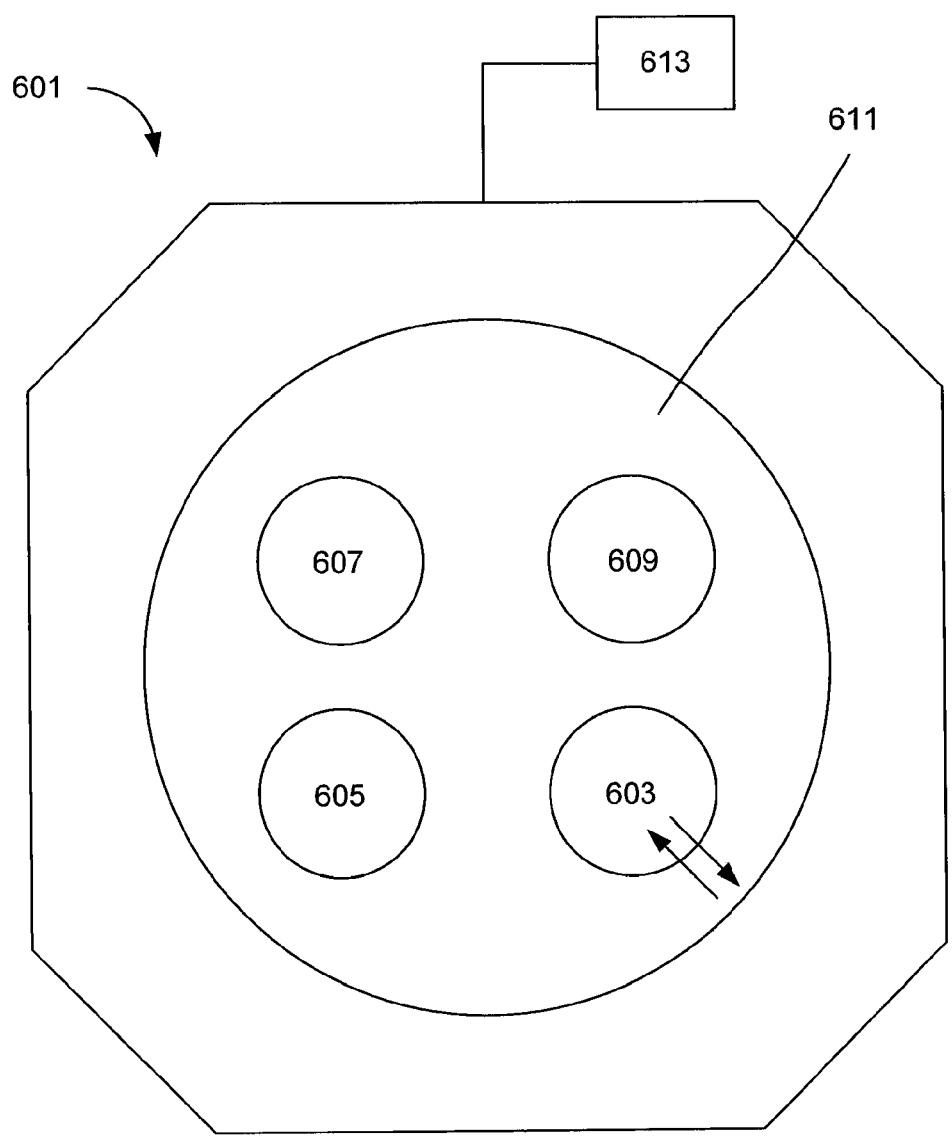
FIG. 6 is a schematic representation of one example of a multi-station apparatus suitable for forming capping layers in accordance with some embodiments of present invention.

In one of the embodiments a multi-station apparatus may be used for forming a capping layer and a diffusion barrier. The multi-station reactor allows one to run different processes concurrently in one chamber environment, thereby increasing the efficiency of wafer processing. One example of such an apparatus is depicted in FIG. 6. A schematic presentation of top view is shown. An apparatus chamber 601 comprises four stations 603-609. In general, any number of stations is possible within the single chamber of a multi-station apparatus. Station 603 is used for loading and unloading of the substrate wafers. Stations 603-609 may have the same or different functions. For example, some of the stations may be devoted to formation of capping layers, while other stations may be used for depositing the dielectric diffusion barrier film.

In one of the embodiments, individual stations can operate under distinct process conditions and may be substantially isolated from each other. For example one station may operate under one temperature regime, while another may operate under a different temperature regime.

In one embodiment, pre-cleaning operation, deposition of the source layer, and formation of the passivated layer are performed in one preferred temperature regime and are carried out in one station of the multi-station apparatus. The deposition of a dielectric diffusion barrier may require a different temperature regime in some embodiments, and may be carried out in a different station or stations. In some embodiments, the entire capping process including pre-treatment, formation of the source layer, passivation, and formation of the dopant-containing cap is performed in one station of a single station or a multi-station apparatus. In some embodiments, deposition of a dielectric diffusion barrier layer may be also performed at the same station as the capping operation.

In one example, station 605 may be devoted to pre-clean and to formation of the capping layer (as well as source layer and passivated layer). Station 605 may operate at a temperature range of about 200-300° C., which is preferred in some embodiments for both capping and pre-clean operation. Deposition of dielectric diffusion barrier material, such as silicon carbide, can be carried out in stations 607, 609, and 603 at a temperature range of about 350 to 400° C., which is the preferred process temperature according in some silicon carbide deposition processes.

Advantageously, pre-clean, deposition of the source layer, passivation, and introduction of dopant, may require similar conditions in some embodiments, and can be performed at one station 605.

According to an embodiment described above, station 605 is a pre-clean station and a protective cap formation station. Stations 607, 609, and 603 may all serve for deposition of dielectric diffusion barrier layer. An indexing plate 611 is used to lift the substrates off the pedestals and to accurately position the substrates at the next processing station. After the wafer substrate is loaded at station 603, it is indexed to station 605, where pre-clean and capping (including source layer deposition and passivation) is performed. The wafer is then moved to station 607 where deposition of diffusion barrier dielectric is performed. The substrate is further indexed to station 609, where further deposition of barrier dielectric is performed, and then indexed to station 603 to deposit more of diffusion barrier. The processed wafer is unloaded at station 603, and the module is charged with a new wafer. During normal operation, a separate substrate occupies each station and each time the process is repeated the substrates are moved to new stations. Thus, an apparatus having four stations 603, 605, 607, and 609 allows simultaneous processing of four wafers, wherein at least one station performs a process that is different from the processes performed at other stations. Alternatively, four wafers may be subjected to identical operations at all four stations, without dedicating certain stations to deposition of a particular layer.

The process conditions and the process flow itself can be controlled by a controller unit 613 which comprises program instructions for monitoring, maintaining and/or adjusting certain process variables, such as HF and LF power, gas flow rates and times, temperature, pressure and the like. For example, instructions specifying flow rates of borane and ammonia for source layer deposition and passivation may be included. The instructions may specify all of the parameters to perform operations, according to methods described above. For example, instructions may include parameters for pre-clean, source layer deposition, formation of the passivated layer, introduction of dopant into the copper line, and dielectric diffusion barrier deposition The controller may comprise different or identical instructions for different apparatus stations, thus allowing the apparatus stations to operate either independently or synchronously.

Figure 7:
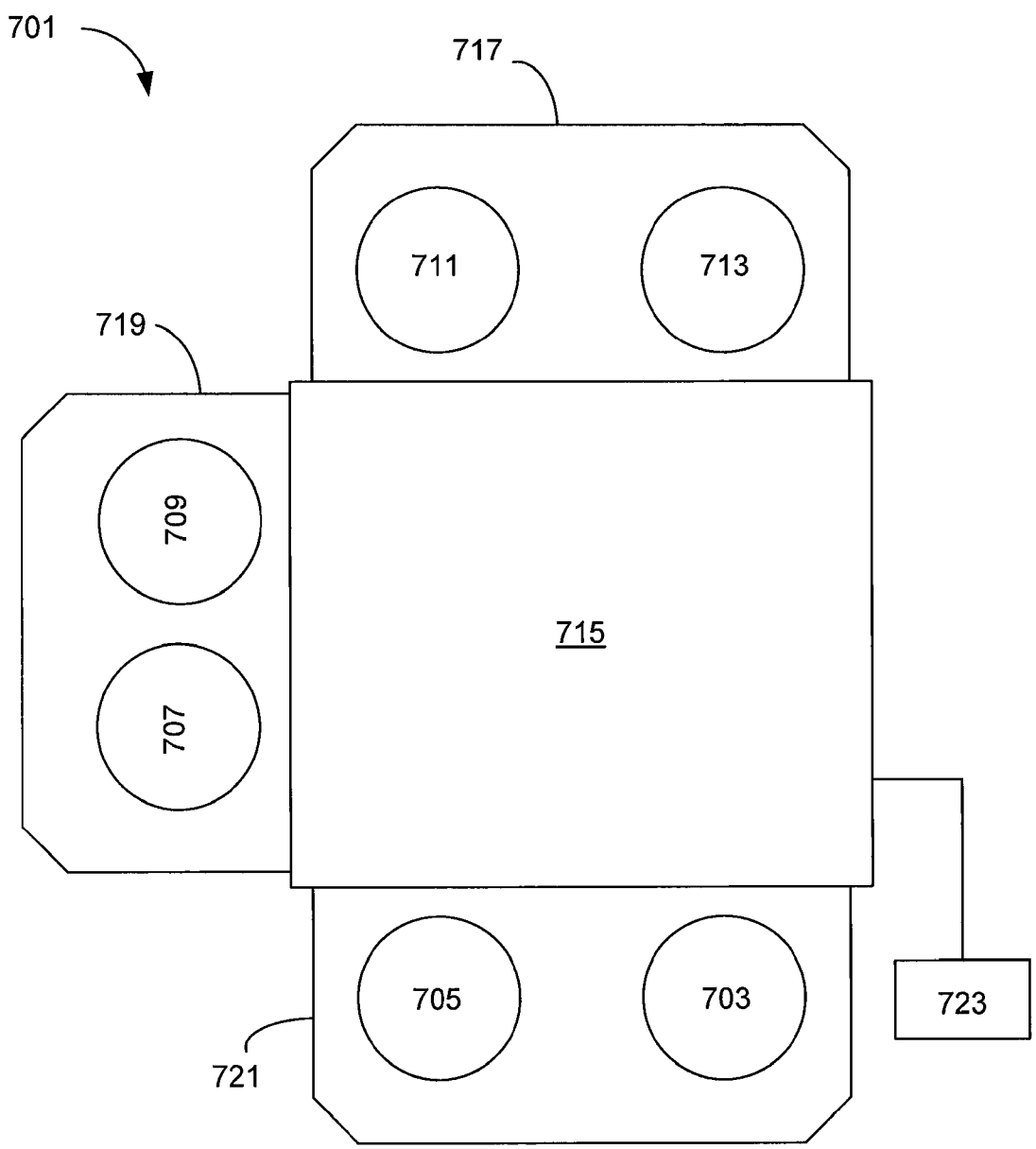
FIG. 7 is a schematic representation of another example of a multi-station apparatus suitable for forming capping layers in accordance with some embodiments of present invention.

Another example of a multi-station apparatus is illustrated in FIG. 7. The multi-station apparatus 701 includes six stations 703, 705, 707, 709, 711, and 713 residing in three separate processing chambers 717, 719, and 721, with two stations residing in each chamber. A robot-containing chamber 715 adjacent chambers 717, 719, and 721 provides mechanism for loading and unloading the wafers into the stations. A controller 723 provides instructions for operation of a multi-station apparatus 701. Individual stations within one chamber are isolatable from each other and may carry out identical or different operations. In one embodiment, two wafers are simultaneously transferred to stations 703 and 705 residing in one chamber 721 and simultaneously undergo identical operations including pre-clean, source layer deposition, formation of passivated layer and copper doping. After this process is completed, the two wafers are removed from the chamber 721, and are simultaneously introduced to stations 707 and 709 residing in chamber 709. In this chamber, a diffusion barrier material layer is simultaneously deposited. The wafers are then removed from chamber 719, and are introduced to stations 711 and 713 residing in chamber 717, where further processing follows. In some embodiments, formation of protective capping layers may be performed in a multi-chamber apparatus with different subprocesses (e.g., source layer deposition, passivation, dopant diffusion) performed in different chambers.

There is a variety of ways, in which the capping process can be implemented in multi-station tools, such as those shown in FIG. 6 and FIG. 7. In general, the described process is easily integrated into the Damascene flow, does not require substantial resource-consuming handling of substrates, and can be performed in the same apparatus as a dielectric diffusion barrier deposition. Further, resistance control via controlled release of dopant is particularly advantageous. The described methods are also useful for forming interconnects with improved adhesion between copper and dielectric diffusion barrier.

Several embodiments of the described methods will now be illustrated by specific examples.

Experimental Example

Fabrication of a copper interconnect having a boron-doped protective cap and a passivated layer containing boron and nitrogen will be illustrated with a reference to an experimental example.

In the described example, the process is started by a plasma pre-clean operation. The partially fabricated semiconductor device having an exposed pattern of copper lines in an ultra low-k dielectric (k=2.5; 5,000 Å thick) was obtained after a CMP operation, and was placed into a process chamber of a PECVD VECTOR™ apparatus. The entire capping process was performed at one station of a four-station apparatus. First, the substrate was pre-heated to 350° C., and $H_2$ was introduced into the process chamber at a flow rate of 4,000 sccm. $H_2$ was flown from second 0 to second 30 of the process time at a pressure of 4 Torr. At second 30 of the process time, HF RF plasma was ignited and was sustained at a power of 1.23 W/cm² until second 45 of the process time. After the substrate was pre-cleaned with $H_2$ plasma, $H_2$ flow and plasma power were turned off, and $B_2H_6$ was introduced into the process chamber in a mixture with argon. The concentration of $B_2H_6$ in the mixture was about 5 volume %, and the mixture was introduced at a flow rate of about 3600 sccm along with $N_2$ introduced at 2400 sccm flow rate. The gases were flown from second 45 to second 85 of the process time, during which time a source layer containing $BH_x$ was deposited on a substrate. Deposition was performed at a temperature of about 350° C. and a pressure of about 2.3 Torr. The thickness of the source layer deposited on top of copper is estimated to be about 215 Å, while the thickness of the source layer deposited on top of dielectric is estimated to be about 159 Å. After the source $BH_x$ layer has been deposited, the borane flow was stopped, and the layer was passivated to form $(BNH)_x$. Passivation was performed between second 85 and second 90 of the process time and involved introducing $NH_3$ at a flow rate of about 7000 sccm along with $N_2$ at a flow rate 2800 sccm. Plasma having an HF component at a power level of 0.80 W/cm², and an LF component with power level of 0.37 W/cm² was ignited and was maintained from second 90 to second 96. Passivation was performed at a temperature of about 35° C. and at a pressure of about 2.3 Torr. It is estimated that the entire thickness of the $BH_x$ layer residing on the dielectric was transformed to $(BNH)_x$ and about 25% of the thickness of the source layer residing over copper was transformed to $(BNH)_x$. The $(BNH)_x$ layer was later analyzed by FT IR spectroscopy. Peaks at 3430 cm$^{-1}$ ($v_{N-H}$), 2560 cm$^{-1}$ ($v_{B-H}$), and 1375 cm$^{-1}$ ($v_{B-N}$) were observed on the IR spectrum.

Boron was allowed to diffuse into the copper line to form the boron-doped capping layer. It is understood that boron diffusion can occur both before and after the top portion of the source layer has been nitrided (passivated). The thickness of the boron-doped cap residing within the copper line was estimated to be about 25-75 Å.

The entire capping process was performed in a single station at a temperature of 350° C. Subsequently, a $Si_xC_yN$, diffusion barrier layer (about 500 Å) was deposited on the substrate in three different station of the PECVD apparatus at 350° C. using tetramethylsilane, ammonia, and nitrogen as a process gas in a plasma. In each of the three stations a third of carbide layer thickness was deposited.

The adhesion energy for Cu (5,000 Å)-$Si_xC_yN_z$(500 Å) sandwich with and without boron-containing cap was measured using four-point bending adhesion test. A higher adhesion energy of 28.4 J/m$^2$ was observed in a sandwich obtained by a method described above as compared to adhesion energy of only 15.3 J/m$^2$ obtained for a conventional sandwich structure without B-doped cap. It is known that improved adhesion typically correlates with improved electromigration performance.

Leakage current and saturated capacitance were also measured for structures containing B-doped protective caps and $(BNH)_x$ passivated layers. It was observed that these parameters are not substantially affected by the described capping procedure.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a semiconductor device structure, the method comprising:
   (a) contacting a substrate having an exposed layer of copper or copper alloy and an exposed layer of dielectric with a compound comprising a second metal, selected from the group consisting of Al, Hf, Co, Ta, Ru, Sn, and Sb to deposit a first layer comprising the second metal over both the dielectric and the layer of copper or copper alloy;
   (b) chemically modifying at least part of the first layer to form a passivated layer comprising the second metal;
   (c) depositing a dielectric layer over the passivated layer, wherein (a)-(c) are performed in one module without exposing the substrate to an ambient atmosphere.

2. The method of claim 1, wherein (a), (b), and (c) are performed in a chemical vapor deposition (CVD) apparatus.

3. The method of claim 1, wherein the second metal is aluminum.

4. The method of claim 1, wherein the dielectric layer deposited in (c) is an etch stop dielectric layer.

5. The method of claim 4, wherein the etch stop dielectric layer comprises doped or undoped material selected from the group consisting of silicon nitride and silicon carbide.

6. The method of claim 1, wherein the dielectric layer deposited in (c) is an inter-layer dielectric (ILD) layer which is deposited directly onto the passivated layer.

7. The method of claim 1, further comprising pre-cleaning the substrate prior to (a) by contacting the substrate with a reducing gas in a plasma.

8. The method of claim 1, wherein the passivated layer comprises a material selected from the group consisting of a metal nitride, a metal oxide, and a metal carbide.

9. The method of claim 1, wherein (a) comprises contacting the substrate with a gas or a vapor of a metal-containing compound in a CVD process chamber without forming a plasma.

10. The method of claim 1, wherein the compound comprising the second metal is selected from the group comprising an organometallic compound, a metal halide, a metal hydride, and a metal carbonyl.

11. The method of claim 10, wherein the compound comprising the second metal is an alkyl-substituted metal derivative or a cyclopentadienyl-substituted metal derivative.

12. The method of claim 10, wherein the compound comprising the second metal is selected from the group consisting of trimethylaluminum, dimethylaluminum hydride, triethylaluminum, triisobutylaluminum, and tris(diethylamino)aluminum.

13. The method of claim 10, wherein the compound comprising the second metal is selected from the group consisting of bis(cyclopentadienyl)cobalt, cobalt (II) acetylacetonate, tetrakis(dimethylamido)hafnium, tetrakis(diethylamido) hafnium, tetrakis(dimethylamido)molybdenum, tetrakis (dimethylamino)titanium (TDMAT), tetrakis(diethylamino) titanium (TDEAT), tetrakis(ethylmethylamido)titanium, bis (diethylamino)bis(diisopropylamino)titanium, pentakis (dimethylamino)tantalum, tert(butylimidotris) (diethylamido)tantalum (TBTDET), pentakis(diethylamido) tantalum, bis(ethylcyclopentadienyl)ruthenium, tris (dimethylamido)antimony, and tetramethyltin.

14. The method of claim 1, wherein the second metal comprises aluminum, and wherein modification of the aluminum-containing first layer comprises forming aluminum oxide.

15. The method of claim 1, wherein (b) comprises contacting the first layer with an oxygen-containing gas selected from the group consisting of $O_2$, $N_2O$ and $CO_2$ to form a passivated layer comprising metal oxide.

16. The method of claim 15, wherein said contacting is performed in a plasma discharge.

17. The method of claim 1, wherein (b) comprises contacting the first layer with a nitrogen-containing reactant selected from the group consisting of ammonia, hydrazine, nitrogen, and an amine to form a passivated layer comprising metal nitride.

18. The method of claim 1, wherein (b) comprises contacting the first layer with a hydrocarbon to form a passivated layer comprising metal carbide.

19. The method of claim 1, wherein (b) comprises forming a passivated layer comprising a material selected from the group consisting of a metal sulfide, metal selenide, metal telluride, and metal phosphide.

20. A semiconductor device comprising a region of dielectric material and a region of copper or copper alloy embedded in the dielectric material, wherein the device further comprises a layer comprising an oxide of a metal selected from the group consisting of Al, Hf, Ti, Co, Ta, Mo, Ru, Sn, and Sb, disposed on the layer of dielectric and on the region of copper or copper alloy, and wherein the region of copper or copper alloy further comprises a metal-containing cap, comprising a metal selected from the group consisting of Al, Hf, Ti, Co, Ta, Mo, Ru, Sn, and Sb at an interface of copper or copper alloy with the layer comprising metal oxide.

21. An apparatus for forming a semiconductor device structure, the apparatus comprising:
   (a) a first process station having an inlet for introduction of gaseous or volatile metal-containing reactants;
   (b) a wafer support for holding the wafer in position during deposition of a metal-containing layer on the wafer substrate in the first process station;
   (c) a second process station configured for depositing a dielectric layer on the wafer substrate
and
   (c) a controller comprising program instructions for:
   (i) contacting a substrate having an exposed layer of copper or copper alloy and an exposed layer of dielectric with a metal-containing reactant comprising a second metal, selected from the group consisting of Al, Hf, Co, Ta, Ru, Sn, and Sb to deposit a first layer, comprising the second metal over both the dielectric and the first metal;
   (ii) chemically modifying at least part of the first layer to form a passivated layer comprising the second metal; and
   (iii) depositing a dielectric layer over the passivated layer, wherein instructions for (i)-(iii) include instructions for performing (i)-(iii) in one module without exposing the substrate to an ambient atmosphere.

* * * * *